(12) United States Patent
Paton et al.

(10) Patent No.: US 6,867,080 B1
(45) Date of Patent: Mar. 15, 2005

(54) POLYSILICON TILTING TO PREVENT GEOMETRY EFFECTS DURING LASER THERMAL ANNEALING

(75) Inventors: Eric N. Paton, Morgan Hill, CA (US); Robert B. Ogle, San Jose, CA (US); Cyrus E. Tabery, Cupertino, CA (US); Qi Xiang, San Jose, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/460,165

(22) Filed: Jun. 13, 2003

(51) Int. Cl.[7] .................... H01L 21/338; H01L 21/331; H01L 21/94

(52) U.S. Cl. .................... 438/183; 438/663; 438/926; 438/321

(58) Field of Search ................ 438/183, 321, 438/926, 663

(56) References Cited

U.S. PATENT DOCUMENTS

| | | | | |
|---|---|---|---|---|
| 5,108,945 A | * | 4/1992 | Matthews | 438/384 |
| 5,468,983 A | * | 11/1995 | Hirase et al. | 257/344 |
| 5,854,125 A | * | 12/1998 | Harvey | 438/626 |
| 5,899,706 A | * | 5/1999 | Kluwe et al. | 438/129 |
| 5,923,969 A | * | 7/1999 | Oyamatsu | 438/183 |
| 5,981,384 A | * | 11/1999 | Juengling | 438/666 |
| 5,994,750 A | * | 11/1999 | Yagi | 257/415 |
| 6,329,232 B1 | * | 12/2001 | Yang et al. | 438/197 |
| 6,333,547 B1 | * | 12/2001 | Tanaka et al. | 257/649 |
| 6,436,807 B1 | * | 8/2002 | Cwynar et al. | 438/619 |
| 6,448,618 B1 | * | 9/2002 | Inaba et al. | 257/391 |
| 6,531,758 B2 | * | 3/2003 | Shin et al. | 257/536 |
| 6,613,621 B2 | * | 9/2003 | Uh et al. | 438/183 |
| 2002/0061614 A1 | * | 5/2002 | Kling et al. | 438/183 |
| 2002/0076867 A1 | * | 6/2002 | Lee et al. | 438/183 |
| 2003/0057496 A1 | * | 3/2003 | Shiau et al. | 257/355 |
| 2003/0098473 A1 | * | 5/2003 | Matsuda et al. | 257/202 |

* cited by examiner

*Primary Examiner*—Carl Whitehead, Jr.
*Assistant Examiner*—James M. Mitchell

(57) ABSTRACT

A method is provided for eliminating uneven heating of substrate active areas during laser thermal annealing (LTA) due to variations in gate electrode density. Embodiments include adding dummy structures, formed simultaneously with the gate electrodes, to "fill in" the spaces between isolated gate electrodes, such that the spacing between the gate electrodes and the dummy structures is the same as the spacing between the densest array of device structures on the substrate surface. Since the surface features (i.e., the gate electrodes and the dummy structures) appear substantially uniform to the LTA laser, the laser radiation is uniformly absorbed by the substrate, and the substrate surface is evenly heated.

16 Claims, 3 Drawing Sheets

POLYSILICON TILTING TO PREVENT GEOMETRY EFFECTS DURING LASER THERMAL ANNEALING

FIELD OF THE INVENTION

The present invention relates to the manufacturing of semiconductor devices, and more particularly, to laser anneal processes having improved heating uniformity.

BACKGROUND OF THE INVENTION

Over the last few decades, the semiconductor industry has undergone a revolution by the use of semiconductor technology to fabricate small, highly integrated electronic devices. A large variety of semiconductor devices have been manufactured having various applications in numerous disciplines. The most common semiconductor technology presently used is silicon-based. One silicon-based semiconductor device is a metal-oxide-semiconductor field-effect transistor (MOSFET). The MOSFET is one of the basic building blocks of modern electronic circuits. These electronic circuits realize improved performance and lower costs as the performance of the MOSFET is increased and as manufacturing costs are reduced.

A typical MOSFET device includes a semiconductor substrate on which a gate electrode, such as a polysilicon line, is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOSFET is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping amorphitizes the silicon substrate, and the activation annealing is used to recrystallize the amorphitized silicon region.

As a result of the limitations of rapid thermal annealing, laser thermal annealing (LTA): is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem associated with laser thermal annealing is that the fluence absorbed by the substrate can vary across the wafer, resulting in uneven heat distribution, due to features of varying density, such as gate electrodes, formed on the surface of the wafer. This occurs because the laser heats the wafer on a localized basis and only on the surface, not throughout its bulk. Therefore, material adjacent to the wafer surface has a large impact on the temperature of the irradiated area of the surface. For example, as the density of gate electrodes (i.e., polysilicon lines) formed on a particular area of a wafer increases, the amount of fluence reflected or scattered from that particular area also increases, as compared to an area with a lesser density of polysilicon lines. When the fluence reflected by a particular area increases, the amount of fluence absorbed by that area decreases. The opposite holds true as the density of polysilicon lines in a particular area decreases. Thus, depending upon the density of the polysilicon lines, the substrate heating at given areas disadvantageously varies across the wafer surface.

Accordingly, a need exists for an improved laser anneal process that allows greater uniformity of heating of the substrate surface despite varying feature density across the surface.

SUMMARY OF THE INVENTION

An advantage of the present invention is a method of manufacturing a semiconductor device that largely eliminates uneven heating of the substrate surface during LTA processing due to variations in surface feature density.

According to the present invention, the foregoing and other advantages are achieved in part by a method of manufacturing a semiconductor device, comprising forming a plurality of gate electrodes on the surface of a semiconductor substrate, the gate electrodes being spaced from each other, the substrate having a first region and a second region, wherein the spacing between the gate electrodes in the first region is smaller than the spacing between the gate electrodes in the second region. Dummy structures are simultaneously formed in the second region such that the spacing between the dummy structures and the second region gate electrodes is substantially the same as the spacing between the first region gate electrodes. During laser thermal annealing, the dummy structures cause the second region to be heated by the laser to substantially the same extent as the first region.

Additional advantages of the present invention will become readily apparent to those skilled in this art from the following detailed description, wherein only exemplary embodiments of the present invention are shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for performing laser thermal annealing (LTA) result in uneven heating of the semiconductor substrate when the surface feature density varies. The present invention addresses and solves such problems stemming from conventional manufacturing processes.

According to the methodology of the present invention, uneven heating of active areas during LTA due to variations in gate electrode density is eliminated by adding dummy structures, formed simultaneously with the gate electrodes, to "fill in" the spaces between isolated gate electrodes. Since the surface features (i.e., the gate electrodes and the dummy structures) appear substantially uniform to the LTA laser, the laser radiation is uniformly absorbed by the substrate, and the substrate surface is evenly heated. As used throughout the present disclosure and claims, the term "substrate" denotes a semiconductor substrate or an epitaxial layer formed on the semiconductor substrate. Substrate 100 refers to a single die area of a semiconductor wafer, as opposed to the entire wafer, since during LTA, typically one die at a time is heated.

Figure 1A:
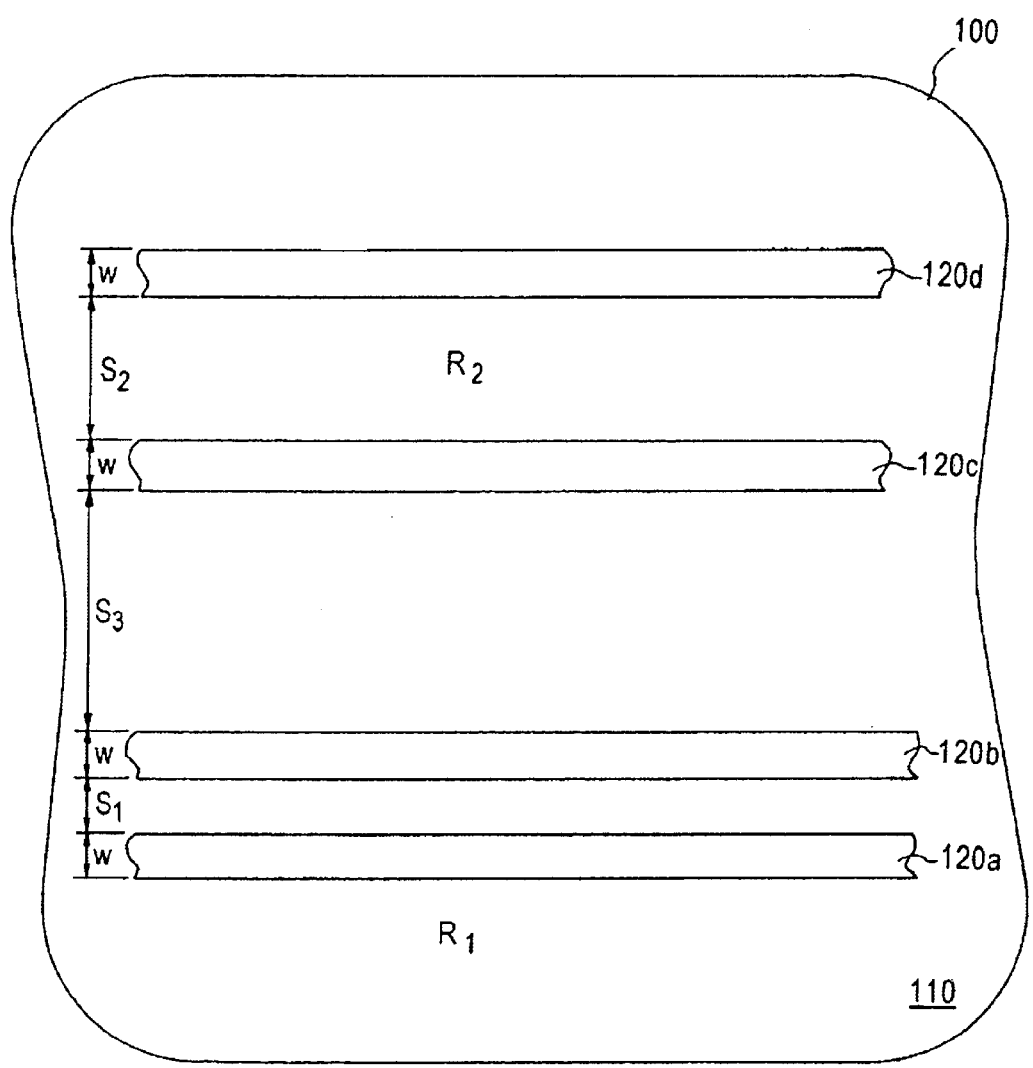
FIGS. 1A–1B schematically illustrate a semiconductor device manufactured in accordance with an embodiment of the present invention.

An embodiment of the present invention will now be described with reference to FIGS. 1A–1B. As shown in FIG. 1A, a substrate 100 is provided and can be formed from any material suitable for integrated circuit manufacture. However, in one aspect, substrate 100 is formed from single-crystal silicon, with a <100> crystallographic orientation and which has been slightly doped with n-type or p-type impurities. Separate MOSFET devices are separated on silicon substrate 100 using isolation structures, such as a field oxide or shallow isolation trenches (not shown).

Shallow isolation trenches, for example, can be formed by etching either isotropically with wet techniques or anisotropically with dry etch techniques. An oxide is thereafter deposited within the trenches. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

A gate dielectric 110 is typically formed on the top surface of substrate 100. Gate dielectric 110 is not limited as to a particular material; however, in one aspect of the invention, gate dielectric 110 is formed from silicon dioxide, for example, using thermal oxidation at temperatures from about 700 to 1000° C. in an oxygen-steam ambient. Although not limited in this manner, gate dielectric 110 can have a thickness from about 10 to 200 angstroms. After deposition of gate dielectric 110, gate electrodes 120a–d are formed over gate dielectric 110.

Although gate electrodes 120a–d are not limited as to a particular material, in one aspect of the invention, the formation of gate electrodes 120a–d involves depositing a blanket layer of undoped polysilicon, for example by low pressure chemical vapor deposition (LPCVD) at temperatures from about 600 to 800° C., on the top surface of gate dielectric 110. Although not limited in this manner, the polysilicon layer can have a thickness from about 100 to 2500 angstroms. A patterned photoresist mask is then photolithographically formed in a conventional manner on the polysilicon layer, and the polysilicon layer is then etched to form gate electrodes 120a–d. Although not limited in this manner, the width w of gate electrodes 120a–d, conventionally called the "gate length", is governed by the design rules of the semiconductor device, and can be from about 500 to 2500 angstroms.

After formation of gate electrodes, source/drain regions (not shown) are formed adjacent to the gate electrodes in a conventional manner, typically by implantation of ion species into substrate 100. These implants will be activated by LTA, as described hereinbelow.

Gate electrodes 120a, 120b are located in a region R1 of substrate 100, and are spaced from each other by a distance s1, such as $0.5\mu$, depending on the design rules of the semiconductor device. Gate electrodes 120c, 120d are located in a region R2 of substrate 100, and are spaced from each other by a distance s2 larger than distance s1, which is typically some multiple of the design rule. Gate electrodes 120b and 120c are spaced apart from each other by a distance s3. Gate electrodes 120c, 120d can be referred to as "isolated" or "sparsely spaced", while gate electrodes 120a, 120b can be referred to as "densely spaced". Of course, there may be more gate electrodes than two in either of regions R1, R2, and there may be only a single gate electrode in a given region, surrounded by empty space.

Figure 1B:
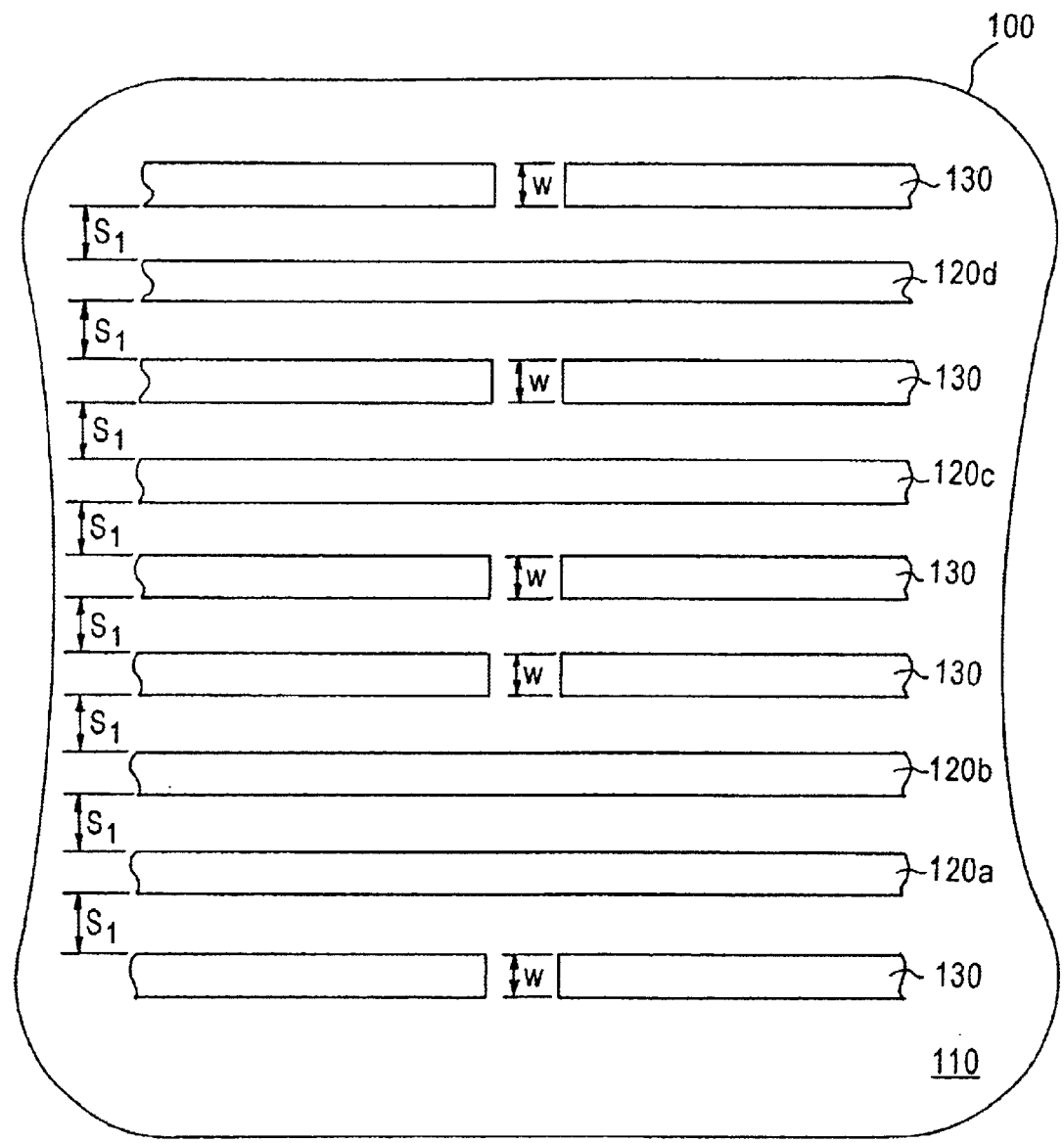

Referring now to FIG. 1B, to avoid uneven heating of substrate 100 during LTA due to the variation in spacing between gate electrodes 120a–d, dummy structures 130 are formed simultaneously with gate electrodes 120a–d such that the spacing between dummy structures 130 and gate electrodes 120a–d is the same as the spacing s1 between the most densely spaced gate electrodes on substrate 100 (i.e., gate electrodes 120a, 120b). Thus, the empty spaces between gate electrodes 120a–d are filled in with dummy structures 130.

Dummy structures 130 are formed simultaneously with gate electrodes 120a–d from a single layer of polysilicon; i.e., by forming a patterned photoresist mask and etching, as described above, and so do not require any additional processing steps. They have the same length w as gate electrodes 120a–d. All device structures (i.e, MOSFETS) on substrate 100 should be surrounded by dummy structures as necessary to fill in empty spaces, so that the spacing between dummy structures and gate electrodes is the same as the spacing between the most densely spaced gate electrodes. The entire surface of substrate 100 should be so patterned, regardless of underlying structures, such as STI structures, thereby avoiding interference patterns and differential reflection of the laser radiation back to the LTA laser source. Of course, the dummy structures will scale according to the design rules of the device.

Figure 2:
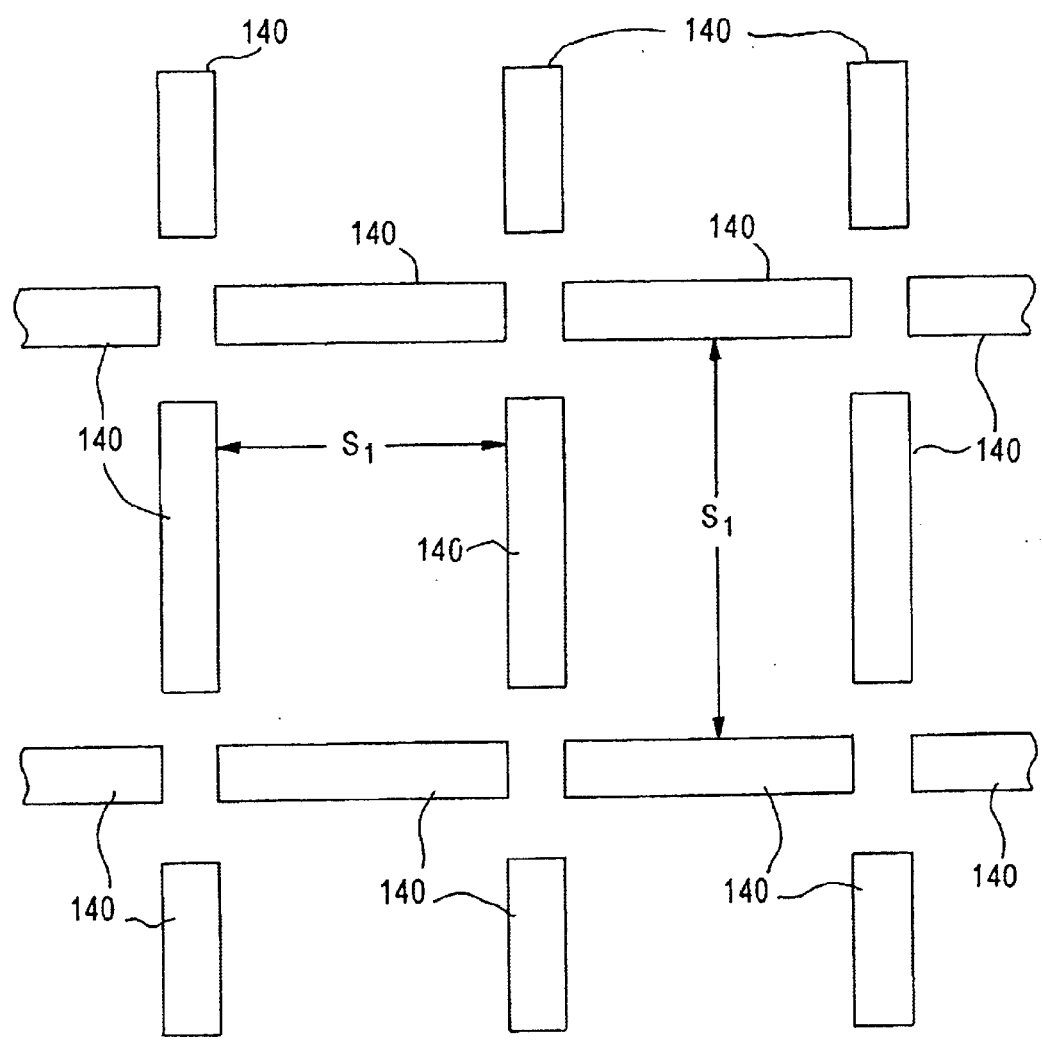
FIG. 2 is a plan view of a pattern of dummy structures according to an embodiment of the present invention.

For large open regions of substrate 100 having no gate electrodes, dummy structures 140 as shown in FIG. 2 can be used, formed substantially as an array of horizontal and vertical broken lines, with the spacing s1 of the most densely spaced gate electrodes on substrate 100 determining the spacing between dummy structures 140. An array of dummy structures 140 can abut or surround the array of dummy structures 130 and gate electrodes 120 shown in FIG. 1A.

After the formation of gate electrodes 120*a–d* and dummy structures 130, 140, the source/drain regions are activated using a conventional laser thermal annealing (LTA) process. Energy from the laser is applied to liquefy substrate 100 to the desired depth of the source/drain regions. As stated above, the fluence absorbed by substrate 100, and the resultant heating of substrate 100, is substantially even over the surface of substrate 100, because the gate electrodes 120 and dummy structures 130, 140 are uniformly dense.

An example of a laser capable of providing laser energy is a spatially homogenized 308 nm XeCl pulsed laser, although the invention is not limited in this manner, and the energy and power of the laser can vary in accordance with different applications. Typically, the source/drain regions extend down from the surface of the silicon substrate 100 to a depth of about 400 angstroms to about 1000 angstroms.

The energy fluence of the laser at the surface determines the melt duration that occurs at the surface, and melt duration is related to maximum melt depth. The relationship between melt duration and maximum melt depth depends on the temporal profile of the laser beam. Precise control of junction or melt depth is possible due to the capability of measuring the full width height maximum (FWHM) of the laser and the surface melt duration during the process. Relatively large changes in the energy fluence are required to create small changes in the maximum melt depth. For example, a fluence range of approximately 100 ml/cm2 to 750 J/cm2 results injunction depths ranging from 200 angstroms to 1500 angstroms from a 308 nm excimer laser at a 9 Hz repetition rate.

After the silicon in the source/drain regions of substrate 100 has been melted, which takes approximately 30–100 nanoseconds, the silicon will cool rapidly, within about one microsecond, and the silicon will reform epitaxially. In so doing, the source/drain regions are activated.

The present invention is applicable to the manufacture of various types of semiconductor devices, particularly high-density semiconductor devices having a design rule of about 0.18□1 and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:

forming a plurality of gate electrodes on the surface of a semiconductor substrate, the gate electrodes being spaced from each other, the substrate having a first region and a second region, wherein the spacing between the gate electrodes in the first region is smaller than the spacing between the gate electrodes in the second region;

forming dummy structures in the second region such that the spacing between the dummy structures and the second region gate electrodes is substantially the same as the spacing between the first region gate electrodes; and laser thermal annealing using a laser;

wherein the dummy structures are formed such that the spacing between the dummy structures and the second region gate electrodes causes the second region to be heated by the laser to substantially the same extent as the first region.

2. The method of claim 1, comprising forming the gate electrodes and dummy structures as polysilicon lines.

3. The method of claim 2, comprising forming the gate electrodes and the dummy structures simultaneously.

4. The method of claim 3, comprising:

forming a layer of polysilicon on the substrate;

photolithographically forming a patterned photoresist mask on the polysilicon layer; and etching to form the gate electrodes and the dummy structures.

5. The method of claim 1, wherein the substrate surface comprises a plurality of regions, including the first and second regions, that are device structure regions having gate electrodes, the method comprising forming the dummy structures in all of the device structure regions where the spacing between the gate electrodes is larger than the spacing between the gate electrodes in the first region.

6. The method of claim 5, wherein the substrate surface comprises open regions without device structures between the device structure regions, the method comprising forming the dummy structures in the open regions such that the spacing between the dummy structures in the open regions is substantially the same as the spacing between the first region gate electrodes.

7. The method of claim 6, comprising forming the dummy structures such that substantially the entire surface of the substrate comprises dummy structures, gate electrodes or both with spacing substantially the same as the spacing between the first region gate electrodes.

8. The method of claim 6, comprising forming the dummy structures in the open regions substantially as an array of horizontal and vertical broken lines.

9. The method of claim 8, comprising forming the dummy structures such that they have a length substantially the same as the length of the gate electrodes.

10. The method of claim 8, wherein the spacing between the first region gate electrodes is about 0.5 $\mu$m.

11. The method of claim 1, comprising forming the dummy structures such that their spacing corresponds to a design rule of the semiconductor device.

12. A method of manufacturing a semiconductor device, comprising the steps of:

forming a plurality of gate electrodes in a first region on the surface of a semiconductor substrate, the gate electrodes being spaced from each other, and at least one gate electrode in a second region on the substrate surface;

forming dummy structures in the second region such that the spacing between the dummy structures and the at least one second region gate electrode is substantially the same as the spacing between the first region gate electrodes; and laser thermal annealing using a laser;

wherein the dummy structures are formed such that the spacing between the dummy structures and the second region gate electrodes causes the second region to be heated by the laser to substantially the same extent as the first region.

13. The method of claim 12, comprising forming the gate electrodes and dummy structures as polysilicon lines.

14. The method of claim 12, wherein the substrate surface comprises an open region without device structures between the first and second regions, the method comprising forming the dummy structures in the open region such that the spacing between the dummy structures in the open region is substantially the same as the spacing between the first region gate electrodes.

15. The method of claim 14, comprising forming the dummy structures such that substantially the entire surface of the substrate comprises dummy structures, gate electrodes or both with spacing substantially the same as the spacing between the first region gate electrodes.

16. The method of claim 14, comprising forming the dummy structures in the open region substantially as an array of horizontal and vertical broken lines.

* * * * *

UNITED STATES PATENT AND TRADEMARK OFFICE
CERTIFICATE OF CORRECTION

PATENT NO. : 6,867,080 B1
DATED : March 15, 2005
INVENTOR(S) : Eric N. Paton et al.

It is certified that error appears in the above-identified patent and that said Letters Patent is hereby corrected as shown below:

<u>Title page, Item [54] and Column 1, line 1,</u>
Title, change "POLYSILICON TILTING" to -- POLYSILICON TILING --

Signed and Sealed this

Twenty-fourth Day of May, 2005

JON W. DUDAS
*Director of the United States Patent and Trademark Office*